United States Patent
Goto et al.

(10) Patent No.: US 6,700,376 B2
(45) Date of Patent: Mar. 2, 2004

(54) METHOD AND APPARATUS FOR CORRECTING STATIC MAGNETIC FIELD USING A PAIR OF MAGNETIC FIELDS WHICH ARE THE SAME OR DIFFERENT FROM EACH OTHER IN INTENSITY AND DIRECTION

(75) Inventors: Takao Goto, Tokyo (JP); Shoei Miyamoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 54 days.

(21) Appl. No.: 10/034,779

(22) Filed: Dec. 28, 2001

(65) Prior Publication Data

US 2002/0105328 A1 Aug. 8, 2002

(30) Foreign Application Priority Data

Feb. 2, 2001 (JP) ........................................ 2001-026559

(51) Int. Cl.$^7$ ................................................ G01V 3/00
(52) U.S. Cl. .................... 324/318; 324/307; 324/309
(58) Field of Search ................ 324/300–320, 324/322; 600/410

(56) References Cited

U.S. PATENT DOCUMENTS

| | | | | |
|---|---|---|---|---|
| 4,284,949 A | * | 8/1981 | Vidrine et al. | 324/315 |
| 4,644,279 A | | 2/1987 | Hoshino | |
| 4,728,895 A | | 3/1988 | Briguet | |
| 5,079,504 A | * | 1/1992 | Machida | 324/309 |
| 5,347,252 A | * | 9/1994 | Ries | 335/299 |
| 5,396,173 A | * | 3/1995 | Sakakura et al. | 324/318 |
| 5,614,880 A | * | 3/1997 | Palkovich et al. | 335/299 |
| 5,633,588 A | * | 5/1997 | Hommei et al. | 324/320 |
| 5,731,704 A | * | 3/1998 | Schnur et al. | 324/320 |
| 5,864,275 A | * | 1/1999 | Ohashi et al. | 335/306 |
| 5,876,337 A | * | 3/1999 | Tsuda | 600/410 |
| 5,936,498 A | * | 8/1999 | Takeshima et al. | 335/216 |
| 6,037,775 A | * | 3/2000 | Shenoy et al. | 324/320 |
| 6,249,121 B1 | * | 6/2001 | Boskamp et al. | 324/318 |
| 6,252,405 B1 | * | 6/2001 | Watkins et al. | 324/319 |
| 6,262,576 B1 | * | 7/2001 | Petropoulos | 324/318 |
| 6,362,623 B1 | * | 3/2002 | Goto | 324/318 |
| 6,433,550 B1 | * | 8/2002 | Kinanen | 324/320 |
| 6,437,672 B1 | * | 8/2002 | Takeshima et al. | 335/216 |
| 6,489,765 B2 | * | 12/2002 | Goto | 324/307 |
| 6,498,488 B2 | * | 12/2002 | Takeshima et al. | 324/318 |
| 6,529,003 B2 | * | 3/2003 | Goto et al. | 324/318 |

FOREIGN PATENT DOCUMENTS

| | | | |
|---|---|---|---|
| GB | 2027208 | | 2/1980 |
| JP | 01303141 | | 7/1989 |
| JP | 232968 | * | 8/2000 |
| WO | 8400611 | | 2/1984 |
| WO | WO 01/55732 A2 | * | 8/2001 |

\* cited by examiner

Primary Examiner—Diego Gutierrez
Assistant Examiner—Dixomara Vargas
(74) Attorney, Agent, or Firm—Moonray Kojima (57) ABSTRACT

To correct static magnetic field intensity and homogeneity of an MRI system, B0 correction coil driving power sources respectively supply correction electric currents to B0 correction coils added to a pair of pillar yokes at the position where an imaging region is interposed therebetween, and the pair of B0 correction coils produce correction magnetic fields in which at least one of the direction and intensity is different, which are then applied to static magnetic fields produced by permanent magnets.

6 Claims, 9 Drawing Sheets

NMR probe

METHOD AND APPARATUS FOR CORRECTING STATIC MAGNETIC FIELD USING A PAIR OF MAGNETIC FIELDS WHICH ARE THE SAME OR DIFFERENT FROM EACH OTHER IN INTENSITY AND DIRECTION

BACKGROUND OF THE INVENTION

The present invention relates to a static magnetic field correction method and an MRI (Magnetic Resonance Imaging) system. More specifically, the present invention relates to a static magnetic field correction method for correcting the static magnetic field intensity of the MRI system, a static magnetic field correction method for correcting the static magnetic field homogeneity of the MRI system, and an MRI system capable of suitably performing the static magnetic field correction methods.

In a permanent magnet type MRI system, variations in the magnetic characteristic of a permanent magnet are large. A plurality of small magnets are added so as to correct the variations to be a target static magnetic field intensity.

On the other hand, the static magnetic field homogeneity of the MRI system is very important to ensure sufficient image quality. In particular, an EPI (Echo Plannar Imaging) method which has been developing in recent years is very sensitive to the static magnetic field homogeneity. The static magnetic field homogeneity must be sufficiently high.

For this reason, a shim material or magnetic adjustment plate is used to correct the static magnetic field homogeneity.

A related art static magnetic field intensity correction method which adds a plurality of small magnets has the problem that rapid or fine correction is difficult.

Further, since fluctuations of the magnetic characteristic of an NdFeB magnet due to temperature are large, the static magnetic field intensity is fluctuated by the influence of heat generation of a gradient coil. When a metal mass is moved near the MRI system (for example, a vehicle is passed), the static magnetic field intensity is fluctuated. It is impossible to handle such fluctuations of the static magnetic field intensity.

On the other hand, a related art static magnetic field homogeneity correction method which uses a shim material or magnetic adjustment plate has the problem that rapid or fine correction is difficult.

SUMMARY OF THE INVENTION

Therefore, a first object of the present invention is to provide a static magnetic field correction method capable of rapidly and finely correcting the static magnetic field intensity of an MRI system and an MRI system capable of suitably performing the static magnetic field correction method.

A second object of the present invention is to provide a static magnetic field correction method capable of rapidly and finely correcting the static magnetic field homogeneity of an MRI system and an MRI system capable of suitably performing the static magnetic field correction method.

In a first aspect, the present invention provides a static magnetic field correction method including the steps of: providing a magnetic field correction coil in a yoke constructing a magnetic circuit of an MRI system, producing a correction magnetic field by flowing a correction electric current to the magnetic field correction coil, and adding a correction magnetic field to the static magnetic field of an imaging region so as to correct the static magnetic field of the imaging region.

In the magnetic field fluctuation measuring method of the first aspect, a magnetic field correction coil is provided in a yoke, to which a correction magnetic field is added. A correction electric current is adjusted to rapidly and finely correct the static magnetic field intensity and homogeneity.

In a second aspect, the present invention provides the static magnetic field correction method thus constructed, further including the steps of: providing a first magnetic field correction coil in a first yoke, providing a second magnetic field correction coil in a second yoke across an imaging region from the first yoke, producing a first correction magnetic field by the first magnetic field correction coil, and producing a second correction magnetic field having its direction and intensity equal to those of the first correction magnetic field by the second magnetic field correction coil.

In the magnetic field fluctuation measuring method of the second aspect, a pair of yokes at the position where an imaging region is interposed therebetween produce correction magnetic fields in which their direction and intensity are equal to each other. The static magnetic field intensity can be corrected.

In a third aspect, the present invention provides the static magnetic field correction method thus constructed, further including the steps of: providing a first magnetic field correction coil in a first yoke, providing a second magnetic field correction coil in a second yoke across an imaging region from the first yoke, producing a first correction magnetic field by the first magnetic field correction coil, and producing a second correction magnetic field having at least one of its direction and intensity different from those of the first correction magnetic field by the second magnetic field correction coil.

In the magnetic field fluctuation measuring method of the third aspect, a pair of yokes at the position where an imaging region is interposed therebetween produce correction magnetic fields in which at least one of the direction and intensity is different. The static magnetic field intensity and homogeneity can be corrected.

In a fourth aspect, the present invention provides the static magnetic field correction method thus constructed, further including the steps of: collecting FID signals, determining a resonance frequency from the FID signals, determining a frequency difference between the resonance frequency and an RF send/receive system, and deciding a correction electric current from the frequency difference.

In the magnetic field fluctuation measuring method of the fourth aspect, a resonance frequency is measured to decide a correction electric current from a frequency difference. The static magnetic field intensity and homogeneity can be corrected accurately.

In a fifth aspect, the present invention provides the static magnetic field correction method thus constructed, further including the steps of: disposing an NMR probe combining a small phantom with a small coil in the vicinity of an imaging region, sending RF pulses from the small coil to receive FID signals from the small phantom by the small coil, and determining a resonance frequency from the FID signals.

In the magnetic field fluctuation measuring method of the fifth aspect, an NMR probe is used to measure a resonance frequency. During imaging a patient, the static magnetic field intensity and homogeneity can be corrected without affecting the imaging. The magnetic field fluctuation measuring method is particularly suitable for correcting the fluctuations.

In a sixth aspect, the present invention provides the static magnetic field correction method thus constructed, further including the steps of: measuring a temperature of a member constructing the magnetic circuit, determining a resonance frequency from a temperature characteristic, determining a frequency difference between the resonance frequency and a target frequency, and deciding a correction electric current from the frequency difference.

In the magnetic field fluctuation measuring method of the sixth aspect, a temperature is measured to decide a correction electric current from a temperature characteristic. The magnetic field fluctuation measuring method is particularly suitable for correcting the fluctuations due to temperature.

In a seventh aspect, the present invention provides an MRI system comprising: a yoke constructing a magnetic circuit, a magnetic field correction coil provided in the yoke for producing a correction magnetic field, and a power source for the magnetic field correction coil for supplying a correction electric current to the magnetic field correction coil.

The MRI system of the seventh aspect can suitably perform the magnetic field fluctuation measuring method of the first aspect.

In an eighth aspect, the present invention provides the MRI system thus constructed, further including: a first yoke and a second yoke at the position where an imaging region is interposed therebetween, a first magnetic field correction coil provided in the first yoke for producing a first correction magnetic field, a second magnetic field correction coil provided in the second yoke and connected in series with the first magnetic field correction coil so as to produce a second correction magnetic field having its direction and intensity equal to those of the first correction magnetic field, and a power source for the magnetic field correction coil for supplying a correction electric current to a series circuit of the first magnetic field correction coil and the second magnetic field correction coil.

The MRI system of the eighth aspect can suitably perform the magnetic field fluctuation measuring method of the second aspect.

In a ninth aspect, the present invention provides the MRI system thus constructed, further including: a first yoke and a second yoke at the position where an imaging region is interposed therebetween, a first magnetic field correction coil provided in the first yoke for producing a first correction magnetic field, a second magnetic field correction coil provided in the second yoke for producing a second correction magnetic field, a power source for the first magnetic field correction coil for supplying a first correction electric current to the first magnetic field correction coil, and a power source for the second magnetic field correction coil for supplying a second correction electric current to the second magnetic field correction coil.

The MRI system of the ninth aspect can suitably perform the magnetic field fluctuation measuring method of the third aspect.

In a tenth aspect, the present invention provides the MRI system thus constructed, further including correction electric current deciding means which collects FID signals, determines a resonance frequency from the FID signals, determines a frequency difference between the resonance frequency and an RF send/receive system, and decides a correction electric current from the frequency difference.

The MRI system of the tenth aspect can suitably perform the magnetic field fluctuation measuring method of the fourth aspect.

In an eleventh aspect, the present invention provides the MRI system thus constructed, further including an NMR probe combining a small phantom with a small coil disposed in the vicinity of an imaging region, wherein
the correction electric current deciding means sends RF pulses from the small coil to receive FID signals from the small phantom by the small coil, and determines a resonance frequency from the FID signals.

The MRI system of the eleventh aspect can suitably perform the magnetic field fluctuation measuring method of the fifth aspect.

In a twelfth aspect, the present invention provides the MRI system thus constructed, further including:
a temperature sensor for measuring a temperature of a member constructing the magnetic circuit; and
a correction electric current deciding means which determines a resonance frequency from the temperature characteristic, determines a frequency difference between the resonance frequency and a target frequency, and decides a correction electric current from the frequency difference.

The MRI system of the twelfth aspect can suitably perform the magnetic field fluctuation measuring method of the sixth aspect.

According to the static magnetic field correction method and the MRI system of the present invention, the static magnetic field intensity and the static magnetic field homogeneity can be corrected rapidly and finely.

Further objects and advantages of the present invention will be apparent from the following description of the preferred embodiments of the invention as illustrated in the accompanying drawings.

DETAILED DESCRIPTION OF THE INVENTION

Embodiments of the present invention will be described hereinbelow with reference to the drawings.

First Embodiment

A first embodiment corrects only the static magnetic field intensity (which does not correct the static magnetic field homogeneity).

Figure 1:
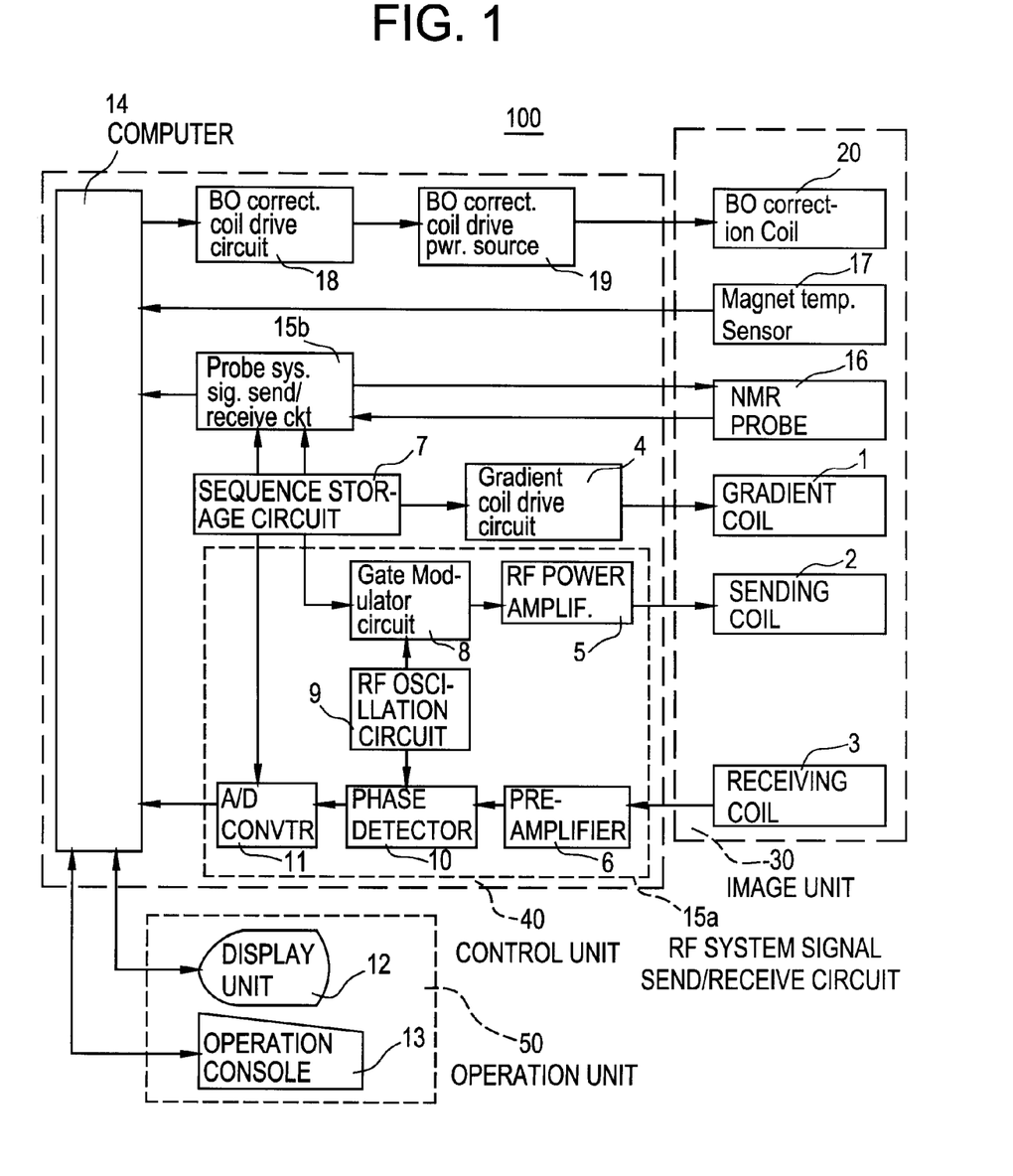
FIG. 1 is a block diagram of an MRI system according to the present invention.

FIG. 1 is a block diagram showing an MRI system 100 according to the first embodiment of the present invention.

The MRI system 100 includes an imaging unit 30, a control unit 40, and an operation unit 50.

The imaging unit 30 includes a gradient coil 1, a sending coil 2, a receiving coil 3, an NMR probe 16, a magnet temperature sensor 17, and a B0 correction coil 20.

The control unit 40 includes a computer 14, a sequence storage circuit 7, a gradient coil driving circuit 4, an RF system signal send/receive circuit 15a, a probe system signal send/receive circuit 15b, a B0 correction coil driving circuit 18, and a B0 correction coil driving circuit 19.

The RF system signal send/receive circuit 15a includes a gate modulator circuit 8, an RF oscillation circuit 9, an RF power amplifier 5, a preamplifier 6, a phase detector 10, and an A/D converter 11.

The probe system signal send/receive circuit 15b is of the same construction as that of the RF system signal send/receive circuit 15a.

The operation unit 50 includes a display unit 12 and an operation console 13.

Figure 2:
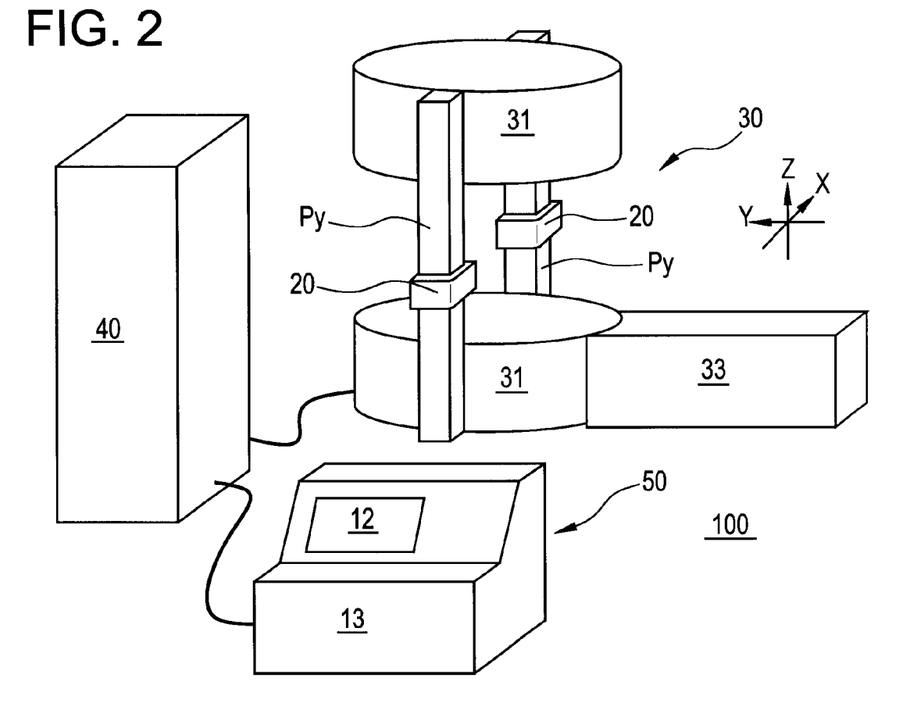
FIG. 2 is a perspective view of the essential part of the MRI system according to the present invention.

FIG. 2 is a schematic perspective view of the MRI system 100.

An imaging unit 30 includes magnet units 31 disposed up and down to be opposite for forming an imaging space therebetween, pillar yokes Py constructing a magnet circuit by magnetically connecting the magnet units 31, B0 correction coils 20 each provided so as to be wound around the center portion of the pillar yoke Py 100 to 200 turns, and a table 33.

Although not shown, the receiving coil 3 is provided in the imaging space formed between the magnet units 31.

Figure 3:
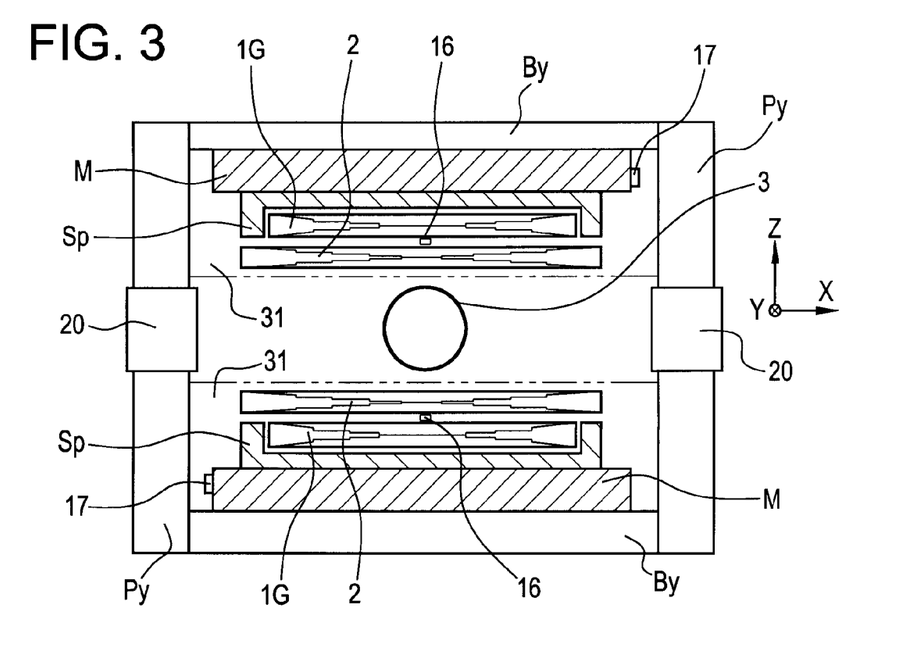
FIG. 3 is a vertical cross-sectional view showing the essential part of the MRI system according to the present invention.

FIG. 3 is a cross-sectional view schematically showing the interior of the magnet units 31.

There is a permanent magnet M for vertically producing a static magnetic field in the magnetic unit 31.

Each of the permanent magnets M is provided on its surface with a magnetic adjustment plate Sp for forming an imaging region of a homogeneous static magnetic field in the receiving coil 3 capable of housing a subject therein.

The permanent magnet M, the magnetic adjustment plate Sp, a base yoke By, and a pillar yoke Py construct a magnetic circuit.

Each of the magnetic adjustment plates Sp is provided on its surface with a gradient coil 1G for producing a gradient magnetic field.

A sending coil 2 is disposed on the inside of the gradient coil 1G.

An NMR probe 16 is disposed so as to be inter posed between the gradient coil 1G and the sending coil 2.

In place of the permanent magnet M, a super conductive magnet may be used.

Figure 4:
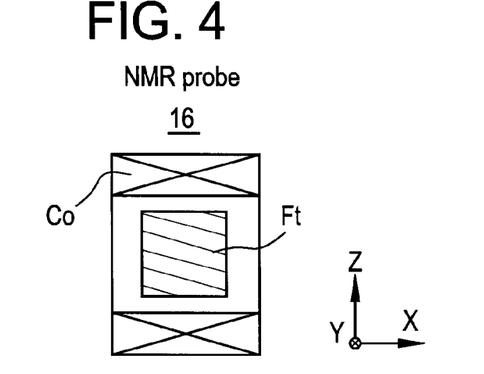
FIG. 4 is a vertical cross-sectional view showing one example of an NMR probe.

FIG. 4 is a cross-sectional explanatory view showing the NMR probe 16.

The NMR probe 16 combines a small phantom Ft sealing an NaCl or a $CuSO_4$ solution capable of generating FID signals and a small coil Co surrounding the small phantom Ft.

Figure 5:
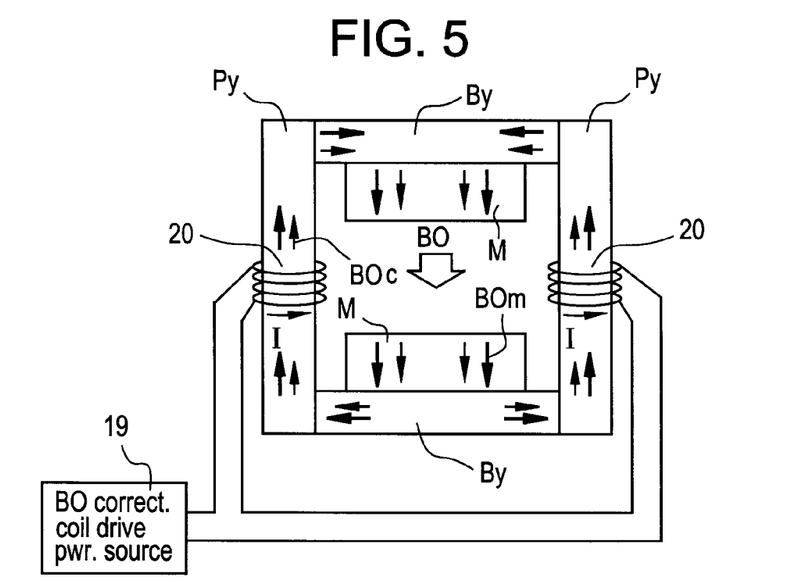
FIG. 5 is a schematic diagram showing correction electric currents according to a first embodiment.

FIG. 5 is an explanatory view of correction electric currents I.

B0 correction coils 20 added to a pair of pillar yokes Py at the position where an imaging region is interposed therebetween are connected in series. Correction electric currents I are supplied from a B0 correction coil driving power source 19. The pair of B0 correction coils 20 produce correction magnetic fields B0c in which their direction and intensity are equal to each other, which are then applied to static magnetic fields B0m produced by the permanent magnets M. The static magnetic fields are corrected to a target static magnetic field intensity B0.

FIG. 5 illustrates the direction of the correction magnetic fields B0c (the direction of the correction electric currents I) by assuming the case where the static magnetic field intensity is insufficient in the static magnetic fields B0m produced by the permanent magnets M. In the case where the static magnetic field intensity is excessive in the static magnetic fields B0m produced by the permanent magnets M, the direction of the correction magnetic fields B0c (the direction of the correction electric currents I) may be reversed.

Figure 6:
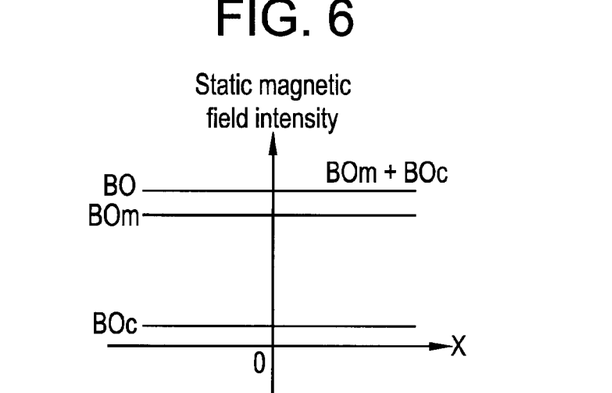
FIG. 6 is a schematic diagram showing a B0 correction magnetic field according to the first embodiment.

FIG. 6 is an explanatory view of a concept in which when the static magnetic field intensity is insufficient in the static magnetic fields B0m produced by the permanent magnets M, the deficiency is compensated by the correction magnetic fields B0c produced by the B0 correction coils 20 to obtain the target static magnetic field intensity B0.

Figure 7:
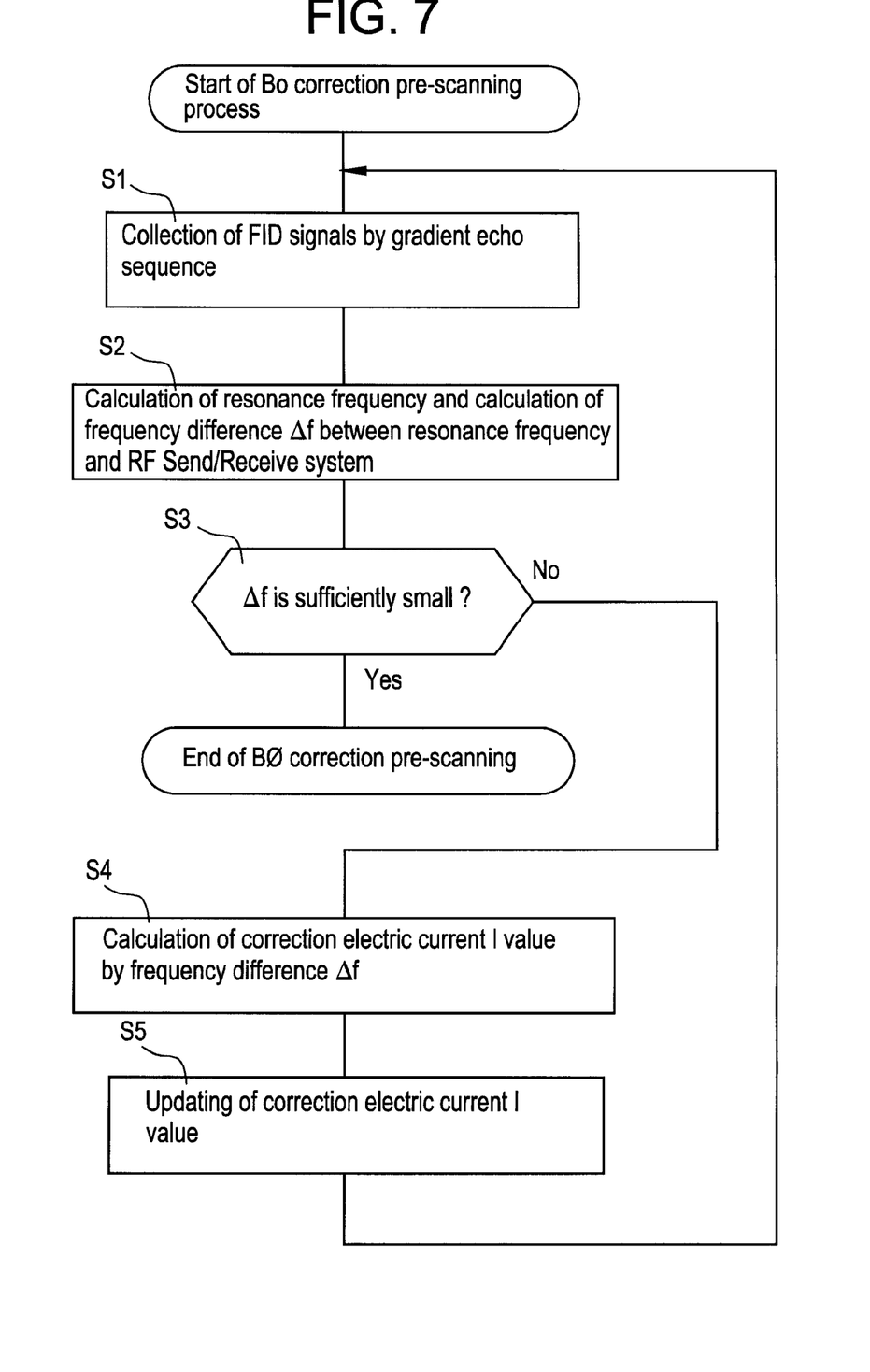
FIG. 7 is a flowchart of a B0 correction pre-scanning process according to the first embodiment.

FIG. 7 is a flowchart showing the procedure of a B0 correction pre-scanning process.

The B0 correction pre-scanning process is executed as one of pre-scanning processes executed for tuning in a state that a subject is placed into the receiving coil 3.

In step S1, in a gradient echo sequence (a pulse sequence in which an RF pulse of α° is sent from the sending coil 2, without using 180° pulses), the receiving coil 3 collects FID signals from the subject.

In step S2, a resonance frequency υ is determined from the FID signals so as to obtain a frequency difference Δf between the resonance frequency υ and the RF send/receive system (a frequency difference between the resonance frequency υ and the oscillating frequency of the RF oscillation circuit 9 of the RF system send/receive circuit 15a).

In step S3, when the frequency difference Δf is not sufficiently small, the routine is advanced to step S4. When it is sufficiently small, the process is ended.

In step S4, a magnetic field difference ΔB0 corresponding to the frequency difference Δf.

$$\Delta B0 = 2\pi \cdot \Delta f / \gamma$$

where γ is a magnetic rotation ratio.

A correction electric current I value for correcting the magnetic field intensity difference ΔB0 is then calculated.

In step S5, the correction electric current I value is updated. The B0 correction coil driving circuit 18 reads the updated correction electric current I value from the computer 14. The B0 correction coil driving power source 19 supplies the updated correction electric current I value to the B0 correction coil 20. The routine is returned to the step S1.

The B0 correction pre-scanning process can correct the static magnetic field B0 so as to be sufficiently close to the target static magnetic field intensity.

Figure 8:
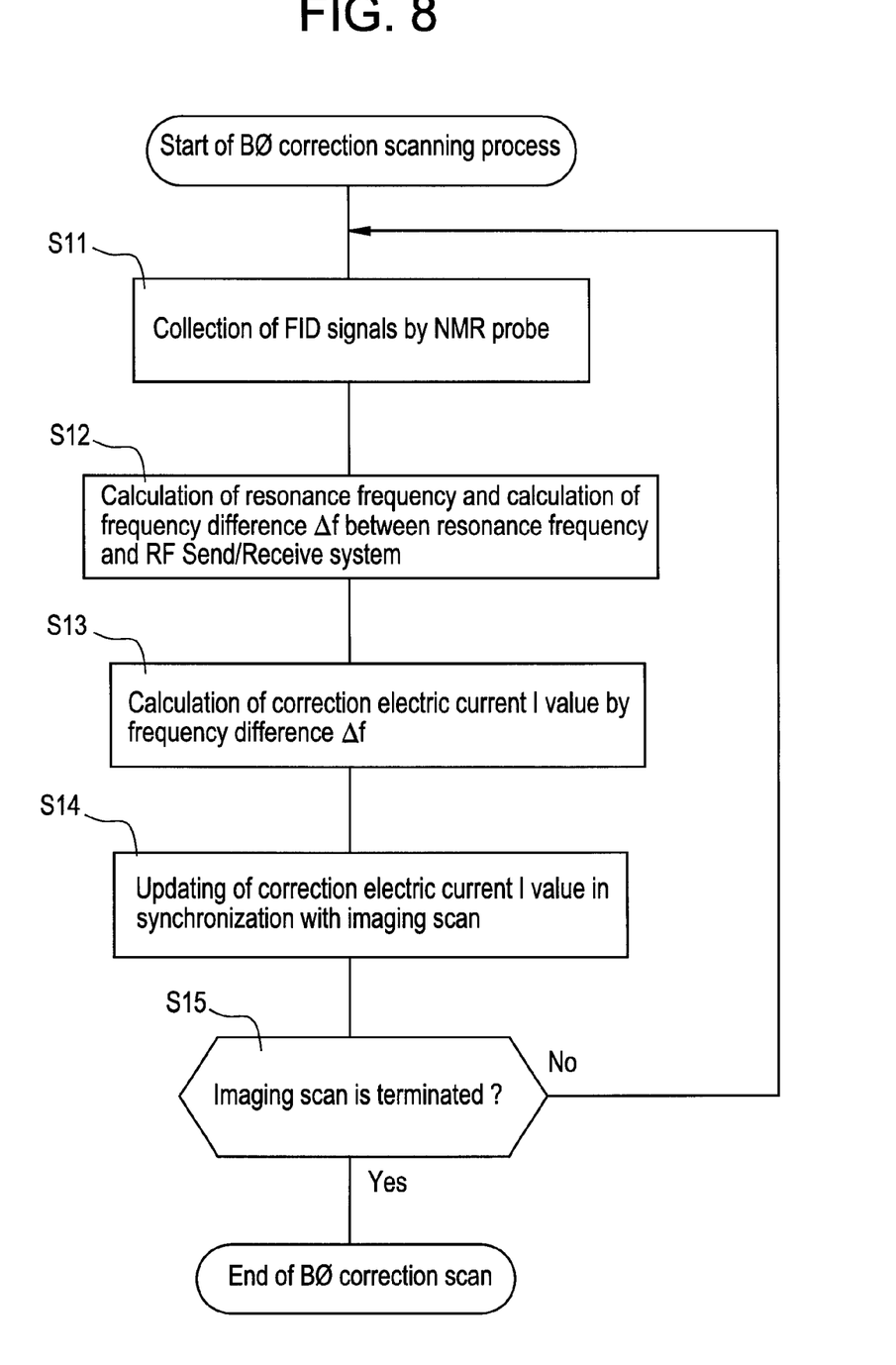
FIG. 8 is a flowchart of a B0 correction scanning process according to the first embodiment.

FIG. 8 is a flowchart showing the procedure of a B0 correction scanning process.

The B0 correction scanning process is executed in synchronization with the imaging scan for imaging a subject.

In step S11, the small coil Co of the NMR probe 16 sends an RF pulse and collects FID signals from the small phantom Ft.

Instep S12, a resonance frequency is determined from the FID signals so as to obtain a frequency difference Δf between the resonance frequency and the RF send/receive system.

In step S13, a correction electric current I value for correcting the magnetic field intensity corresponding to the frequency difference Δf is calculated.

In step S14, the correction electric current I value is updated in synchronization with the repeated pulse sequence of the imaging scan. The B0 correction coil driving circuit 18 reads the updated correction electric current I value from the computer 14. The B0 correction coil driving power source 19 supplies the updated correction electric current I value to the B0 correction coil 20.

In step S15, the steps S11 to S14 are repeated until the imaging scan is completed. At completion of the imaging scan, the process is ended.

The B0 correction scanning process can correct the static magnetic field B0 to the target static magnetic field intensity during imaging scan.

Figure 9:
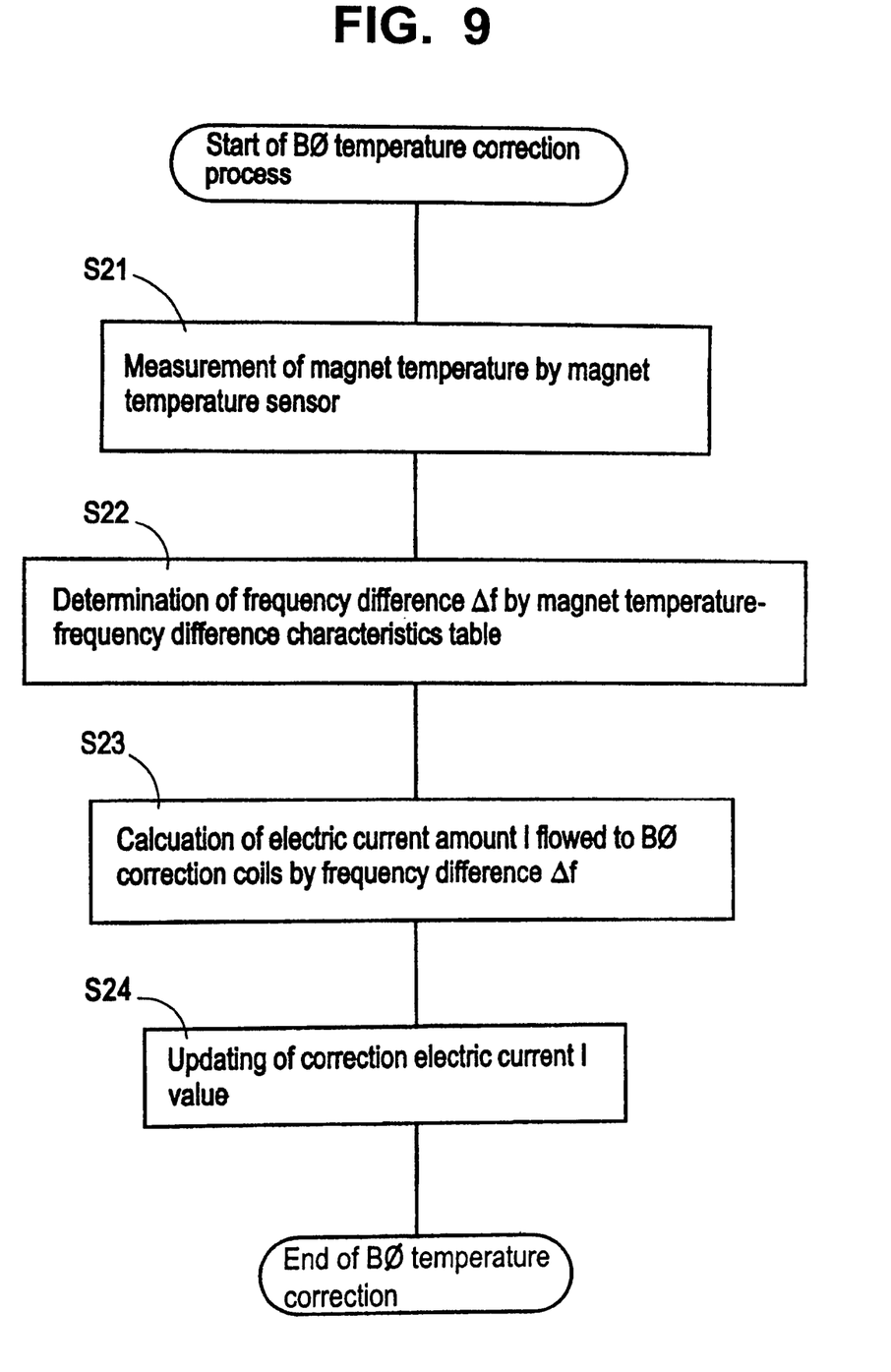
FIG. 9 is a flowchart of a B0 temperature correction process according to the first embodiment.

FIG. 9 is a flowchart showing the procedure of a B0 temperature correction process.

The B0 temperature correction process may be executed in synchronization with the imaging scan, be executed periodically irrespective of the imaging scan, or be executed with a given timing.

In step S21, the magnet temperature sensor 17 measures a magnet temperature.

In step S22, a magnet temperature-frequency difference characteristic table previously measured and created is used to convert the magnet temperature to a frequency difference Δf.

In step S23, a correction electric current I value for correcting the magnetic field intensity corresponding to the frequency difference Δf is calculated.

In step S24, the correction electric current I value is updated. During imaging scan, the correction electric current I value is updated in synchronization with the repeated pulse sequence. The B0 correction coil driving circuit 18 reads the updated correction electric current I value from the computer 14. The B0 correction coil driving power source 19 supplies the updated correction electric current I value to the B0 correction coil 20. The process is ended.

The B0 temperature correction process can correct fluctuations of the static magnetic field intensity B0 due to heat generation of the gradient coil 1.

The MRI system 100 of the first embodiment can rapidly and finely correct the static magnetic field intensity.

Second Embodiment

A second embodiment corrects the static magnetic field intensity and homogeneity.

Figure 10:
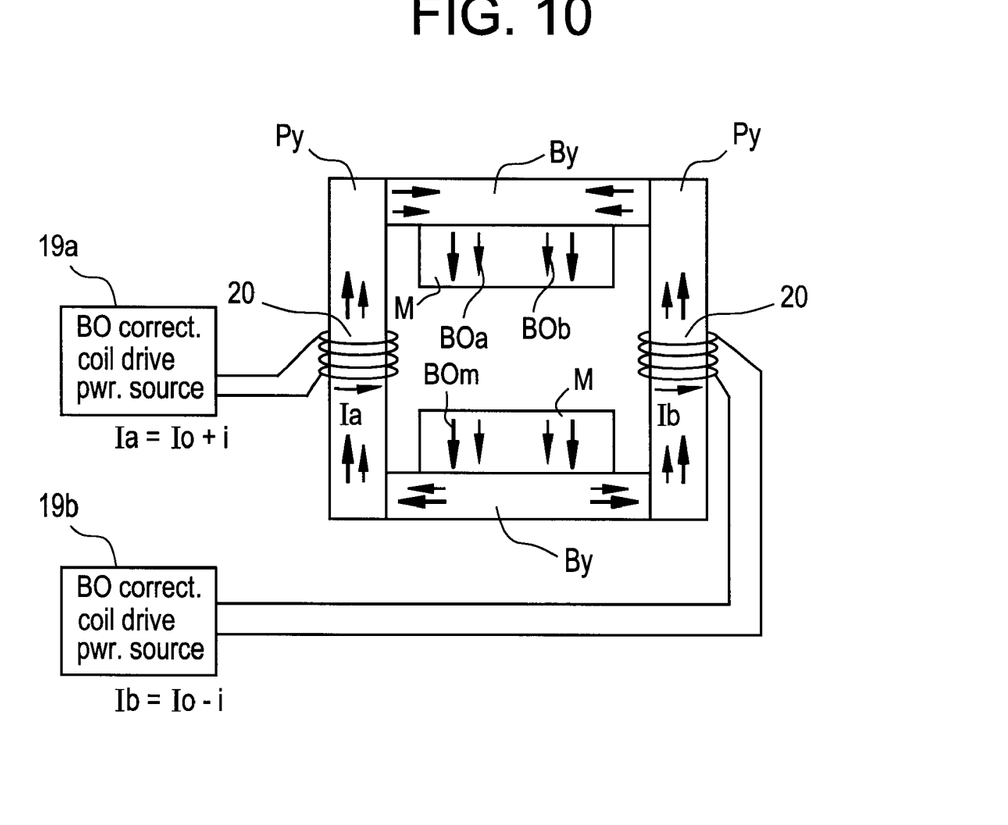
FIG. 10 is a schematic diagram showing correction electric currents according to a second embodiment.

FIG. 10 is an explanatory view of correction electric currents Ia and Ib.

B0 correction coil driving power sources 19a and 19b respectively supply the correction electric currents Ia and Ib to B0 correction coils 20 added to a pair of pillar yokes Py at the position where an imaging region is interposed therebetween. The pair of B0 correction coils 20 produce correction magnetic fields B0a and B0b in which at least one of the direction and intensity is different, which are then applied to the static magnetic fields B0m produced by the permanent magnets M.

The correction electric currents Ia and Ib consist of a 0-dimensional component Io for compensating the excess and deficiency of the static magnetic field intensity in the center of the imaging region and a 1-dimensional component i for compensating the one-dimensional static magnetic field in homogeneity. In other words, the 1-dimensional component i causes an intensity difference between the correction magnetic fields B0a and B0b, so that a 1-dimensional gradient can be formed in a correction magnetic field B0c synthesizing the correction magnetic fields B0a and B0b. This 1-dimensional gradient compensates the one-dimensional static magnetic field in homogeneity.

FIG. 10 illustrates the direction of the correction magnetic fields B0a and B0b (the direction of the correction electric currents Ia and Ib) by assuming the case where the static magnetic field intensity is insufficient in the static magnetic field B0m produced by the permanent magnet M. In the case where the static magnetic field intensity is excessive in the static magnetic field B0m produced by the permanent magnet M, either or both directions of the correction magnetic fields B0a and B0b (either or both directions of the correction electric currents Ia and Ib) may be reversed.

Figure 11:
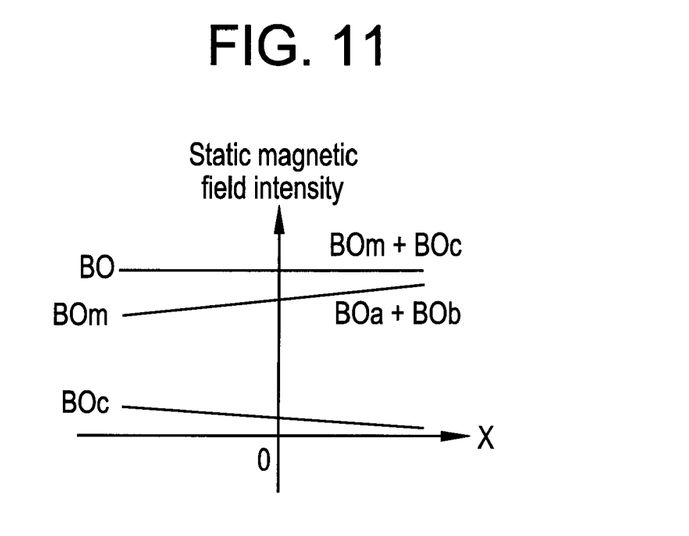
FIG. 11 is a schematic diagram showing a B0 correction magnetic field according to the second embodiment.

FIG. 11 is an explanatory view of a concept in which in the case where the static magnetic field intensity is insufficient and a 1-dimensional in homogeneity exists in the static magnetic field B0m produced by the permanent magnet M, the insufficient static magnetic field intensity and the 1-dimensional in homogeneity are compensated by correction magnetic fields Ba and Bb produced by the B0 correction coils 20 so as to obtain a target static magnetic field intensity B0 and static magnetic field homogeneity.

The 0-dimensional component Io of the correction electric currents Ia and Ib can be decided as in the first embodiment.

Figure 12:
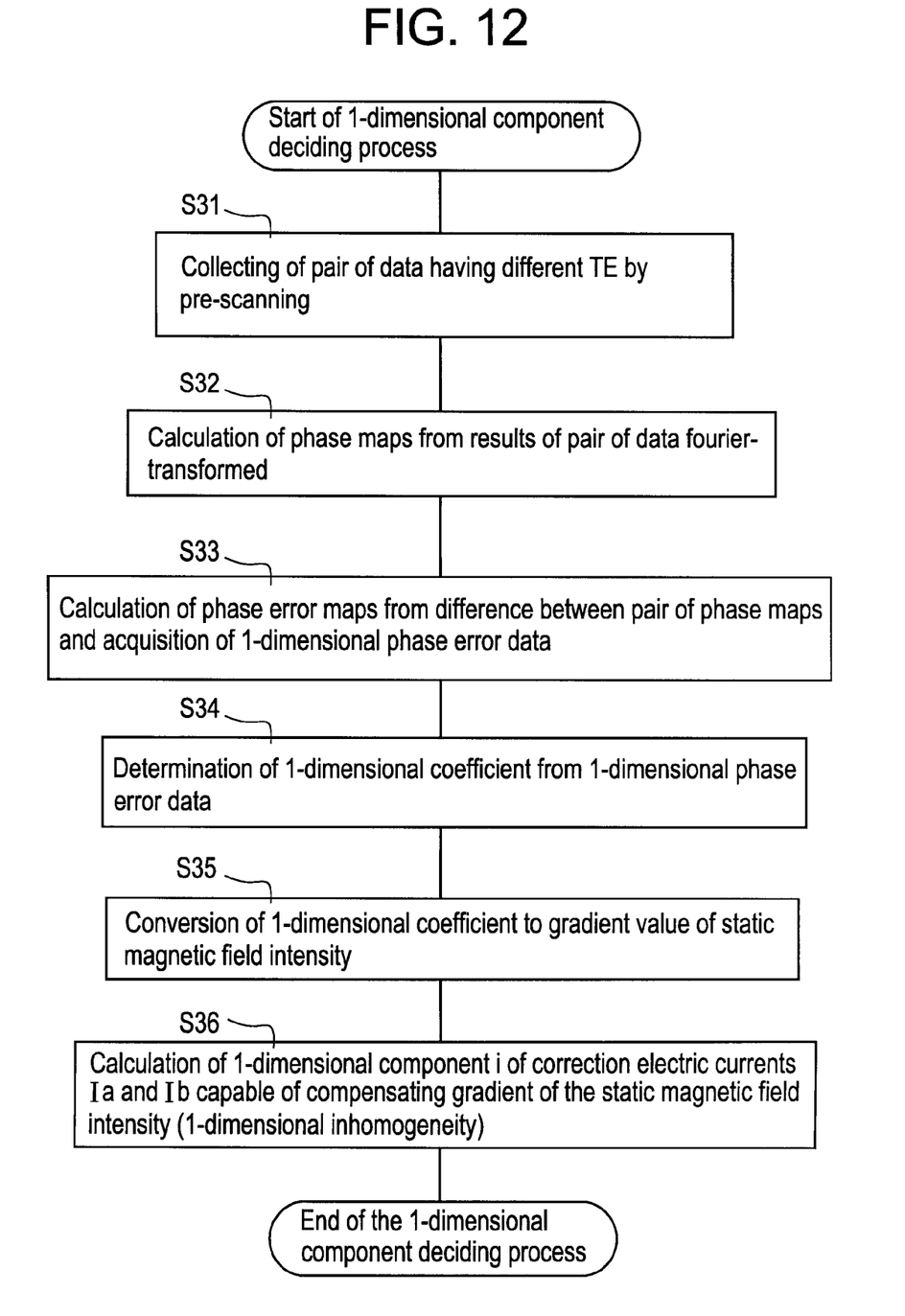
FIG. 12 is a flowchart of a 1-dimensional component deciding process according to the second embodiment.

The 1-dimensional component i of the correction electric currents Ia and Ib can be decided by a 1-dimensional component deciding process explained below.

FIG. 12 is a flowchart showing the procedure of the 1-dimensional component deciding process.

The 1-dimensional component deciding process is executed as one of pre-scanning processes executed for tuning in a state that a subject is placed in the receiving coil 3.

In step S31, when the direction of the 1-dimensional gradient formed by the correction magnetic field B0c is X-axis, the XZ plane as a scanned surface is pre-scanned so as to collect two-plane data Rxz1 and Rxz2 in which TE (echo time) is different by ΔTE[sec]. Further, the XY plane as a scanned surface is pre-scanned so as to collect two-plane data Rxy1 and Rxy2 in which TE (echo time) is different by ΔTE.

In step S32, the data Rxz1, Rxz2, Rxy1 and Rxy2 are respectively 2-dimensional Fourier-transformed to obtain complex number two-dimensional data. Then, angle two-dimensional data in which only an angle determined by arctangent of the real part and the imaginary part of each pixel is a pixel value are calculated, respectively. These angle 2-dimensional data are called phase maps Mxz1, Mxz2, Mxy1 and Mxy2.

In step S33, a phase error map Nxz is determined from the difference between two phase maps Mxz1 and Mxz2. Further, a phase error map Nxy is determined from the difference between two phase maps Mxy1 and Mxy2. The noise part is removed from the phase error map Nxz to sample only the signal part. When there is a part whose phase is folded, the folding part is eliminated and the data are averaged in the Z direction so as to obtain 1-dimensional phase error data Fxz(x). Further, the noise part is removed from the phase error map Nxy to sample only the signal part. When there is a part whose phase is folded, the folding part is eliminated, and the data are averaged in the Y direction so as to obtain 1-dimensional phase error data Fxy(x).

In step S34, the 1-dimensional phase error data are least-square-approximated.

$Fxz(x) = Pxz0 + Pxz1 \cdot x + Pxz2 \cdot x^2 + \ldots$ $Fxy(x) = Pxy0 + Pxy1 \cdot x + Pxy2 \cdot x^2 + \ldots$ The average of the coefficients Pxz1 and Pxy1 is 1-dimensional coefficient Px1. The 1-dimensional coefficient Px1 is the amount of phase in which the spin is rotated by the magnetic field in homogeneity during the time ΔTE[sec] and is a 1-dimensional component in the X-axis direction. The unit thereof is [rad/cm].

In step S35, the 1-dimensional coefficient Px1 [rad/cm] is converted to a gradient value ΔG [Gauss/cm] in the X-axis direction of the static magnetic filed intensity.

$$\Delta G = Px1/(2\pi \cdot \Delta TE \cdot \gamma)$$

where γ=4257 [Hz/Gauss]

In step S36, there is calculated a 1-dimensional component i of the correction electric currents Ia and Ib which can compensate the gradient value ΔG in the X-axis direction of the static magnetic field intensity or the 1-dimensional in homogeneity in the X-axis direction of the static magnetic field.

According to the MRI system of the second embodiment, the static magnetic field intensity and the static magnetic field homogeneity in the X direction can be corrected rapidly and finely.

Third Embodiment

A third embodiment has four pillar yokes Py.

Figure 13:
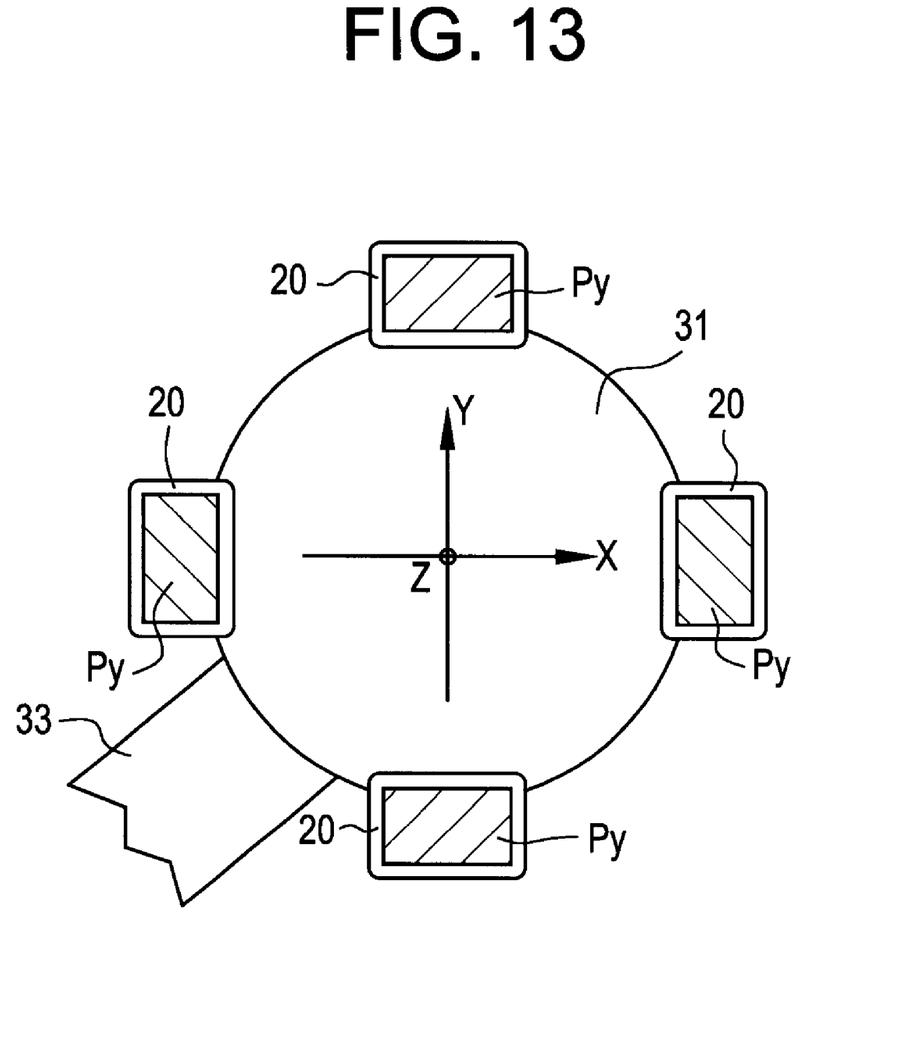
FIG. 13 is a horizontal cross-sectional view showing pillar yokes according to a third embodiment.

As shown in FIG. 13, each of the four pillar yokes Py is provided with the B0 correction coil 20, and the B0 correction coils 20 provided in the opposite pillar yokes Py are paired to control correction electric currents.

According to the MRI system of the third embodiment, the static magnetic field intensity and the static magnetic field homogeneity in the X-Y direction can be corrected rapidly and finely.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus comprising:
a permanent magnet producing a static magnetic field in a space to which an object is placed for diagnosis;
a pair of yokes magnetically coupled to said permanent magnet;
a pair of separate coils, each disposed on a respective one of said pair of yokes and providing magnetic fields which are added to or subtracted from said static magnetic field; and
means for selectively applying in a parallel manner current to said pair of separate coils to produce respective corrective magnetic fields so as to control the magnetic intensity of said static magnetic field to be of a target value.

2. The apparatus of claim 1, wherein said means for selectively applying comprises means for applying current to said pair of separate coils having 0-dimensional component and 1-dimensional component to compensate for 1-dimensional static magnetic field inhomogeneity.

3. A B0 correction method of an MRI apparatus comprising a permanent magnet for producing a static magnetic field, a pair of yokes magnetically coupled to said permanent magnet, a pair of separate coils, each disposed on a respective one of said pair of yokes and providing magnetic fields which are added to or subtracted from said static magnetic field, and means for selectively applying current in a parallel manner to said pair of separate coils to produce respectively corrective magnetic fields so as to control the magnetic intensity of said static magnetic field to be of a target value, said method comprising the steps of:
collecting FID signals by gradient echo sequence;
calculating resonance frequency and frequency difference between said resonance frequency and RF send/receive signal frequency;
determining whether said frequency difference is sufficiently small;
in the event said frequency difference is not sufficiently small, then calculating a correction electric current value to be applied by said means for selectively applying by using said frequency difference;
then, updating said correction electric current value; and
repeating the foregoing steps until said frequency difference is sufficiently small, thereby completing pre-scanning processing.

4. The method of claim 3, comprising the further steps of:
collecting another set of FID signals using an NMR probe;
calculating another resonance frequency and another difference frequency between said another resonance frequency and an RF send/receive signal frequency;
calculating another correction electric current value using said another difference frequency;
updating said another correction electric current value in synchronism with an imaging scan; and
determining whether said imaging scan is terminated.

5. The method of claim 3, further comprising the steps of:
measuring magnetic temperature using a magnetic temperature sensor;
determining another frequency difference by use of a magnetic temperature difference characteristic table;
calculating another electric current amount supplied to said pair of correction coils by use of said another frequency difference; and
updating said another correction electric current value.

6. The method of claim 3, wherein said means for selectively applying comprises two separate power sources and said correction electric current supplied to said pair of correction coils provides magnetic fields which enable correction of said static magnetic field intensity and compensation for inhomogeneity; said method further comprising the steps of:
collecting a pair of data having different TE by pre-scanning;
calculating phase maps from results of said pair of data which are Fourier transformed;
calculating phase error mpas from a difference between said pair of phase maps and acquisition of 1-dimensional phase error data;
determining 1-dimensional coefficient from a 1-dimensional phase error data;
converting said 1-dimensional coefficient to a gradient value of static magnetic field intensity; and
calculating a 1-dimensional component of another correction electric current capable of compensating gradient of said static magnetic field 1-dimensional inhomogeneity.

* * * * *